United States Patent
Morioka

(10) Patent No.: US 9,971,106 B2
(45) Date of Patent: May 15, 2018

(54) OPTICAL RECEPTACLE AND OPTICAL MODULE

(71) Applicant: Enplas Corporation, Saitama (JP)

(72) Inventor: Shimpei Morioka, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days. days.

(21) Appl. No.: 15/500,743

(22) PCT Filed: Jul. 16, 2015

(86) PCT No.: PCT/JP2015/070354
§ 371 (c)(1),
(2) Date: Jan. 31, 2017

(87) PCT Pub. No.: WO2016/021384
PCT Pub. Date: Feb. 11, 2016

(65) Prior Publication Data
US 2017/0219784 A1 Aug. 3, 2017

(30) Foreign Application Priority Data
Aug. 4, 2014 (JP) .................... 2014-158787

(51) Int. Cl.
*G02B 6/26* (2006.01)
*G02B 6/42* (2006.01)

(52) U.S. Cl.
CPC .......... *G02B 6/4206* (2013.01); *G02B 6/424* (2013.01); *G02B 6/4214* (2013.01); *G02B 6/4249* (2013.01); *G02B 6/4286* (2013.01)

(58) Field of Classification Search
None
See application file for complete search history.

(56) References Cited

U.S. PATENT DOCUMENTS 6,406,196 B1 * 6/2002 Uno .................... G02B 6/12007
385/47
7,123,798 B2 * 10/2006 Fukuyama ........... G02B 6/3636
385/47
(Continued)

FOREIGN PATENT DOCUMENTS

CN 101109835 A 1/2008
JP 09-113768 A 5/1997
(Continued)

OTHER PUBLICATIONS

International Search Report from International Application No. PCT/JP2015/070354 dated Oct. 13, 2015.

*Primary Examiner* — Sung Pak
(74) *Attorney, Agent, or Firm* — Brundidge & Stanger, P.C.

(57) ABSTRACT

This optical receptacle comprises: a first optical surface through which light from a photoelectric conversion element is incident; a second optical surface through which the incident light is emitted to the optical transmitter side; an optical separation part which separates the incident light into monitor light that goes to a detection element and signal light that goes to the optical transmitter; and a third optical surface through which the monitor light is emitted to the detection element side. The securing part secures the optical transmitter such that the signal light from the second optical surface arrives at the end surface of the optical transmitter at a position farther than the focus of the second optical surface. The light flux diameter in the light separation part of the light incident through the second optical surface is smaller than the light flux diameter of the light in the second optical surface.

4 Claims, 11 Drawing Sheets

(56) References Cited

U.S. PATENT DOCUMENTS

| | | | |
|---|---|---|---|
| 7,195,402 B2 * | 3/2007 | Fukuyama | G02B 6/4214 385/49 |
| 7,324,729 B2 * | 1/2008 | Fukuyama | G02B 6/4246 385/15 |
| 2008/0019412 A1 | 1/2008 | Ishibashi | |
| 2014/0241733 A1 * | 8/2014 | Moriyama | G02B 6/4206 398/138 |
| 2014/0328558 A1 | 11/2014 | Morioka et al. | |
| 2015/0010272 A1 | 1/2015 | Tanazawa | |
| 2015/0355409 A1 * | 12/2015 | Yanagisawa | G02B 6/322 385/14 |
| 2016/0313517 A1 * | 10/2016 | Yamamoto | G02B 6/4214 |
| 2016/0313519 A1 * | 10/2016 | Yanagisawa | G02B 6/4244 |
| 2017/0059790 A1 * | 3/2017 | Koyama | G02B 6/421 |
| 2017/0123170 A1 * | 5/2017 | Furuya | G02B 6/421 |

FOREIGN PATENT DOCUMENTS

| | | |
|---|---|---|
| JP | 2013-137507 A | 7/2013 |
| JP | 2013-171112 A | 9/2013 |
| JP | 2015-014748 A | 1/2015 |

\* cited by examiner

OPTICAL RECEPTACLE AND OPTICAL MODULE

TECHNICAL FIELD

The present invention relates to an optical receptacle and an optical module including the optical receptacle.

BACKGROUND ART

Conventionally, in optical communications using an optical transmission member such as an optical fiber and an optical waveguide, an optical module including a light emitting element such as a surface-emitting laser (for example, VCSEL: Vertical Cavity Surface Emitting Laser) has been used. The optical module includes an optical receptacle which allows for incidence of light containing communication information emitted from a light emitting element on an end surface of the optical transmission member.

In addition, for the purpose of adjusting the light output or stabilizing the output characteristics of a light emitting element against temperature variation, some optical modules include a detection element for checking (monitoring) the intensity and the quantity of the light emitted from the light emitting element.

For example, PTL 1 discloses an optical module including a photoelectric conversion device in which a light emitting element and a detection element are disposed, and an optical receptacle configured to optically connect the light emitting element and an end surface of an optical transmission member.

The optical module disclosed in PTL 1 includes the photoelectric conversion device and the optical receptacle. The optical receptacle includes a first optical surface on which light emitted from a light emitting element is incident; a second optical surface configured to emit light advanced through the inside of the optical receptacle is condensed at an end surface of the optical transmission member; a reflection surface configured to reflect, toward the second optical surface, light which is incident on the first optical surface; a light separation part configured to separate light reflected by the reflection surface into monitor light travelling toward the receiving element and signal light travelling toward an end surface of the optical transmission member; and a third optical surface configured to emit the monitor light toward the detection element. In addition, the light separation part includes a division reflection surface that is an inclined surface inclined to the optical axis of light reflected by the reflection surface and is configured to reflect a part of light reflected by the reflection surface toward the detection element; a division transmission surface that is a surface perpendicular to the optical axis and is configured to allow the other part of the light reflected by the reflection surface to pass therethrough toward the second optical surface; and a division step surface that is a surface parallel to the optical axis.

In the optical module disclosed in PTL 1, the light which is emitted from the light emitting element and is incident on the first optical surface is reflected at the reflection surface toward the light separation part. The light reflected by the reflection surface is separated by the light separation part into signal light and monitor light. The monitor light separated by the light separation part is emitted from the third optical surface toward the light reception surface of the detection element. On the other hand, the signal light separated by the light separation part is emitted from the second optical surface toward an end surface of the optical transmission member. As described, PTL 1 discloses an optical module of the transmission side which includes an optical receptacle configured to couple light emitted from a light emitting element with an end surface of an optical transmission member.

CITATION LIST

Patent Literature

PTL 1
Japanese Patent Application Laid-Open No. 2013-137507

SUMMARY OF INVENTION

Technical Problem

It is conceivable to use the optical module disclosed in PTL 1 as an optical module of the reception side, or an optical module of the transmission side and the reception side. For example, by replacing all the light emitting elements with light receiving elements such as photodetectors, the optical module disclosed in PTL 1 can be used as an optical module of the reception side. In addition, by replacing some of the light emitting elements with light receiving elements, the optical module disclosed in PTL 1 can be used as an optical module of the transmission side and the reception side. In the above-mentioned cases, light emitted from an end surface of the optical transmission member reaches the light receiving element through the second optical surface, the light separation part, the reflection surface and the first optical surface.

In the case where the optical module disclosed in PTL 1 is used also as an optical module of the reception side, light which is incident on the second optical surface passes through the light separation part. At this time, the light which is incident on the second optical surface is separated by the light separation part into light travelling toward light receiving element and light travelling in a direction opposite to the detection element (light not travelling toward the light receiving element or the detection element). As a result, there is a problem that, in the case where the optical module disclosed in PTL 1 is used also as the optical module of the reception side, the quantity of light that reaches the light reception surface of the light receiving element is significantly small relative to the quantity of light emitted from an end surface of the optical transmission member.

In view of this, an object of the present invention is to provide an optical receptacle which includes a light separation part and can suppress reduction of the quantity of light which reaches the light receiving element even when used for reception. In addition, another object of the present invention is to provide an optical module including the optical receptacle.

Solution to Problem

An optical receptacle according to embodiments of present invention is disposed between one or more optical transmission members and one or more photoelectric conversion devices including one or more photoelectric conversion elements and one or more detection elements for monitoring light emitted from the photoelectric conversion element, the optical receptacle being configured for optically coupling the photoelectric conversion element and an end surface of the optical transmission member, the optical receptacle including: one or more first optical surfaces configured to allow incidence of light emitted from the photoelectric conversion element, or emit, toward the photoelectric conversion element, light which is emitted from the end surface of the optical transmission member and is advanced through an inside of the optical receptacle; one or more second optical surfaces configured to emit, toward the end surface of the optical transmission member, light incident on the first optical surface, or allow incidence of light emitted from the end surface of the optical transmission member; a light separation part disposed on a light path between the first optical surface and the second optical surface, and configured to separate light incident on the first optical surface into monitor light travelling toward the detection element and signal light travelling toward the end surface of the optical transmission member, or allow at least a part of light incident on the second optical surface to pass therethrough toward the first optical surface side; one or more third optical surfaces configured to emit, toward the detection element, monitor light separated at the light separation part; and a fixing part configured to dispose the end surface of the optical transmission member such that the end surface faces the second optical surface. The fixing part fixes the optical transmission member such that signal light emitted from the second optical surface reaches the end surface of the optical transmission member at a remote position relative to a focus of the second optical surface, and a light flux diameter at the light separation part of light incident on the second optical surface is smaller than a light flux diameter of light at the second optical surface.

An optical module according to embodiments of present invention includes: the optical receptacle; and a photoelectric conversion device including a substrate, one or more photoelectric conversion elements disposed on the substrate, and one or more detection elements disposed on the substrate and configured to monitor light emitted from the photoelectric conversion device.

Advantageous Effects of Invention

According to the present invention, it is possible to provide an optical receptacle that includes a light separation part and can optically couple in an efficient manner the photoelectric conversion element (the light emitting element or the light receiving element) and an end surface of the optical transmission member in both of transmission and reception, and an optical module including the same.

DESCRIPTION OF EMBODIMENTS

In the following, embodiments of the present invention will be described in detail with reference to the accompanying drawings.

Embodiment 1

(Configuration of Optical Module)

Figure 1A:
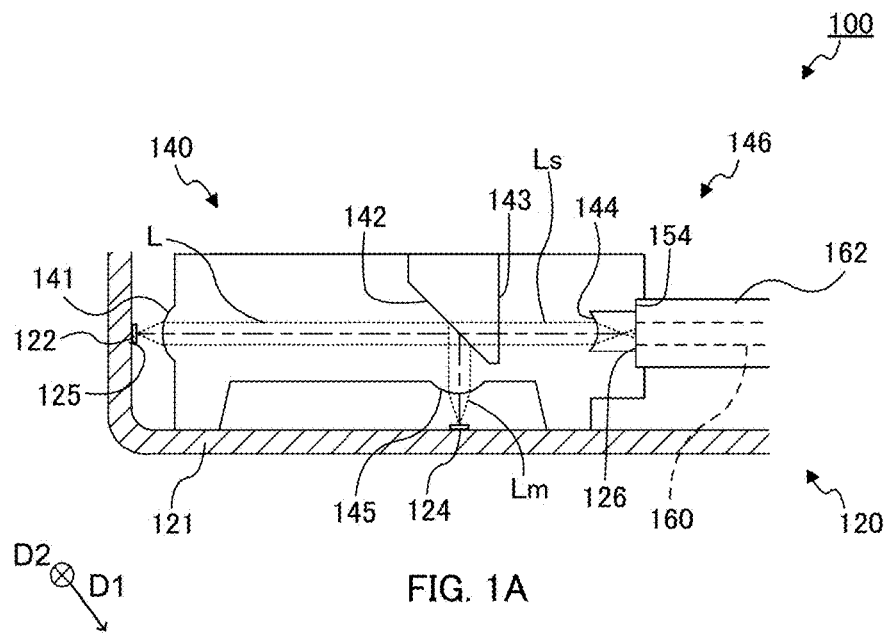
FIGS. 1A and 1B are sectional views of an optical module according to Embodiment 1.
Figure 1B:
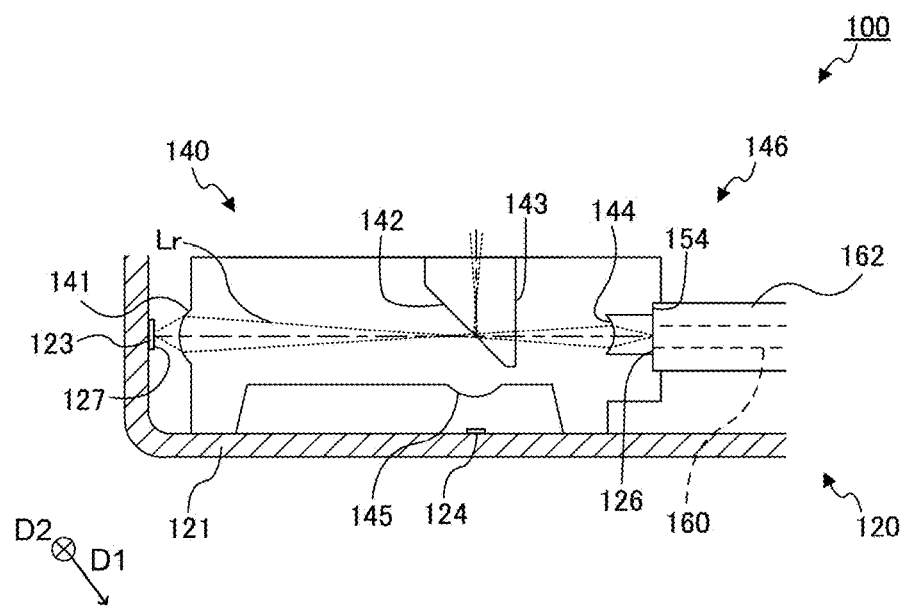

FIGS. 1A and 1B are sectional views of optical module 100 according to Embodiment 1 of the present invention. FIG. 1A illustrates light paths in a transmission side region of optical module 100, and FIG. 1B illustrates light paths in a reception side region of optical module 100. It is to be noted that, in FIG. 1A and FIG. 1B, the hatching of the cross section of optical receptacle 140 is omitted to illustrate light paths in optical receptacle 140.

As illustrated in FIG. 1A and FIG. 1B, optical module 100 includes photoelectric conversion device 120 of substrate mounting type including a photoelectric conversion element (light emitting element 122 and/or light receiving element 123), and optical receptacle 140. In optical module 100, a plurality of optical transmission members 160 are connected to optical receptacle 140 through ferrule 162 when in use. The type of optical transmission member 160 is not limited, and optical transmission member 160 may be an optical fiber, a light waveguide or the like. In the present embodiment, a plurality of optical transmission members 160 are a plurality of optical fibers disposed in one line at a constant interval. The optical fiber may be of a single mode type, or a multiple mode type. It is to be noted that optical transmission members 160 may be disposed in two or more lines.

Photoelectric conversion device 120 includes substrate 121, four light emitting elements 122, four light receiving elements 123, and four detection elements 124. Substrate 121 is a flexible substrate, for example. Four light emitting elements 122, four light receiving elements 123 and four detection elements 124 are disposed on substrate 121.

Light emitting element 122 is disposed on substrate 121, and emits laser light in a direction perpendicular to the installation part of substrate 121 where light emitting element 122 is disposed. The number of light emitting elements 122 is not limited. In the present embodiment, the number of light emitting elements 122 is four. In addition, the position of light emitting element 122 is not limited. In the present embodiment, four light emitting elements are disposed in one line at a constant interval. Light emitting element 122 is a vertical cavity surface emitting laser (VCSEL), for example. It is to be noted that, when optical transmission members 160 are disposed in two or more lines, the number of the lines of light emitting elements 122 may be identical to that of optical transmission members 160.

Light receiving element 123 is disposed on the same surface of substrate 121 on which light emitting element 122 is disposed, and is configured to receive reception light Lr from end surface 126 of optical transmission member 160. The number of light receiving elements 123 is not limited. In the present embodiment, the number of light receiving elements 123 is four. In addition, the position of light receiving element 123 is also not limited. In the present embodiment, four light receiving elements 123 are disposed in one line at a constant interval. Light receiving element 123 is a photodetector, for example. In addition, in the present embodiment, four light emitting elements 122 and four light receiving elements 123 are disposed in one line at a constant interval. Although details are described later, light emitting surface 125 of light emitting element 122 and light reception surface 127 of light receiving element 123 may not be disposed on the same plane.

Detection element 124 receives monitor light Lm for monitoring the output of emission light L emitted from light emitting element 122 (for example, the intensity and the quantity of the light). Detection element 124 is a photodetector, for example. The number of detection elements 124 is not limited. In the present embodiment, the number of detection elements 124 is four. Four detection elements 124 corresponding to four light emitting elements 122 are disposed in one line.

Optical receptacle 140 is disposed on substrate 121 of photoelectric conversion device 120. Disposed between photoelectric conversion device 120 and optical transmission member 160, optical receptacle 140 optically connects light emitting surface 125 of light emitting element 122 or light reception surface 127 of light receiving element 123, and end surfaces 126 of a plurality of optical transmission members 160. In the following, a configuration of optical receptacle 140 is described in detail.

(Configuration of Optical Receptacle)

Figure 2A:
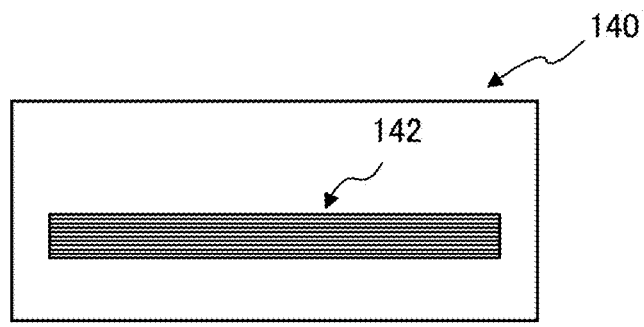
FIGS. 2A to 2D illustrate a configuration of an optical receptacle according to Embodiment 1.
Figure 2B:
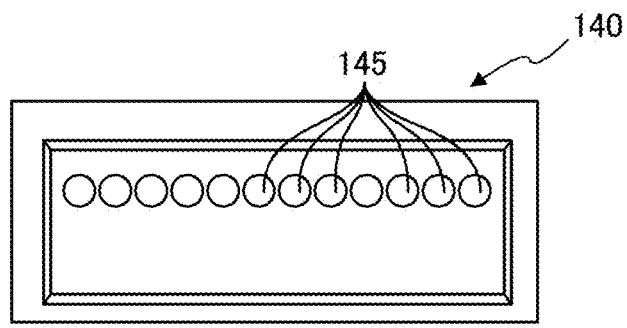
Figure 2C:
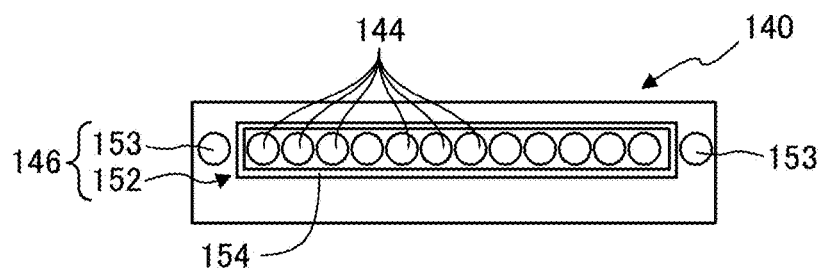
Figure 2D:
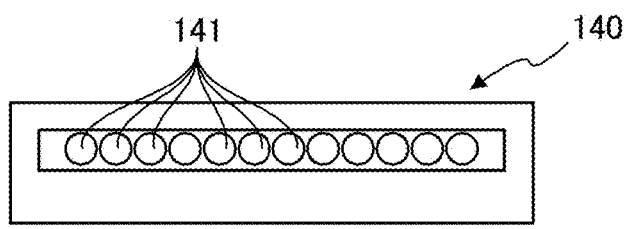

FIGS. 2A to 2D illustrate a configuration of optical receptacle 140 according to Embodiment 1. FIG. 2A is a plan view of optical receptacle 140, FIG. 2B is a bottom view of optical receptacle 140, FIG. 2C is a front view of optical receptacle 140, and FIG. 2D is a rear view of optical receptacle 140.

As illustrated in FIG. 1A to FIG. 2D, optical receptacle 140 is a member having a substantially cuboid shape. Optical receptacle 140 has light transmissivity, and emits, toward end surface 126 of optical transmission member 160, emission light L emitted from light emitting surface 125 of emitting element 122, and, emits, toward light reception surface 127 of light receiving element 123, reception light Lr from optical transmission member 160. Optical receptacle 140 includes a plurality of first optical surfaces 141, light separation part 142, transmission surface 143, a plurality of second optical surfaces 144, a plurality of third optical surfaces 145, and fixing part 146. Optical receptacle 140 is formed using a material having a transparency to light of the wavelength used in optical communications. Examples of such a material include transparent resins such as polyetherimide (PEI) and cyclic olefin resin. In addition, for example, optical receptacle 140 is manufactured by injection molding.

First optical surface 141 refracts emission light L emitted from light emitting element 122 and allows the light to enter optical receptacle 140, and, first optical surface 141 refracts reception light Lr from optical transmission member 160 and emits the light toward light receiving element 123 from optical receptacle 140. In the present embodiment, first optical surface 141 has a shape of a convex lens protruding toward light emitting element 122. First optical surface 141 converts emission light L emitted from light emitting element 122 into collimate light. In addition, in the present embodiment, a plurality of (twelve) first optical surfaces 141 are disposed in one line in the long side direction on the back surface of optical receptacle 140 in such a manner as to face light emitting surface 125 of light emitting element 122 or light reception surface 127 of light receiving element 123. In addition, first optical surface 141 has a circular shape in plan view. The light incident on first optical surface 141 advances toward light separation part 142. It is to be noted that, when the photoelectric conversion elements (light emitting element 122 and light receiving element 123) are disposed in two or more lines, the number of the lines of first optical surfaces 141 is identical to that of the photoelectric conversion devices. It is to be noted that, of twelve first optical surfaces 141 in FIG. 2D in the present embodiment, four transmission side first optical surfaces 141 on the left end side are used as first optical surface 141, and other four first optical surfaces 141 on the right end side are used as the reception side first optical surface. That is, emission light L emitted from light emitting element 122 is incident on four transmission side first optical surfaces 141 on the left end, and reception light Lr having passed through the inside is emitted from four reception side first optical surfaces 141 on the right end. In this manner, in optical receptacle 140 according to the present embodiment, with respect to a plane that equally divides twelve first optical surfaces 141 and is perpendicular to substrate 121, one region functions as the transmission side region, and the other region functions as the reception side region.

Light separation part 142 separates emission light (collimate light) L of a predetermined light flux diameter incident on first optical surface 141 into monitor light Lm travelling toward detection element 124, and signal light Ls travelling toward second optical surface (end surface 126 of optical transmission member 160) while allowing at least a part of reception light Lr incident on second optical surface 144 to pass therethrough. Light separation part 142 is a region composed of a plurality of surfaces, and is disposed on the top surface side of optical receptacle 140.

Figure 3A:
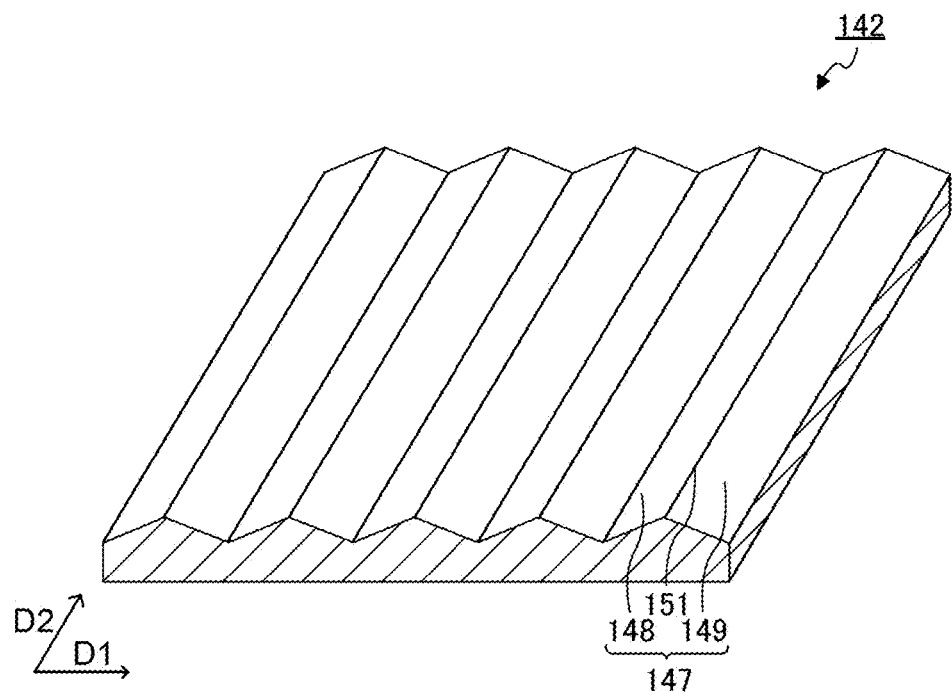
FIGS. 3A and 3B illustrate a configuration of a light separation part.
Figure 3B:
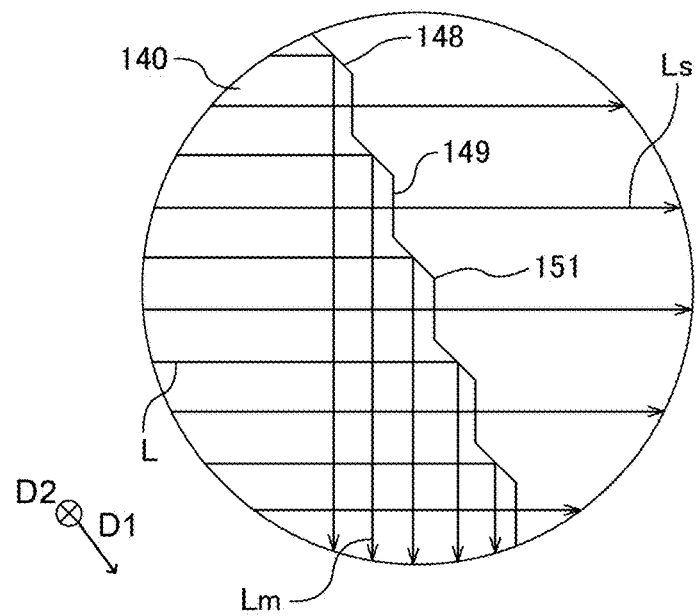

FIGS. 3A and 3B illustrate a configuration of light separation part 142. FIG. 3A is a perspective view of light separation part 142, and FIG. 3B is a partially enlarged sectional view illustrating light paths of light separation part 142. In FIG. 3B, the hatching of the cross section of optical receptacle 140 is omitted to illustrate light paths in optical receptacle 140.

As illustrated in FIGS. 3A and 3B, light separation part 142 includes a plurality of separation units 147. While the number of separation units 147 is not limited, four to six separation units 147 are disposed in the region where emission light L incident on first optical surface 141 reaches. Each separation unit 147 includes one division reflection surface 148 and one division transmission surface 149. That is, light separation parts 142 include a plurality of division reflection surfaces 148 and a plurality of division transmission surfaces 149. In the following description, the inclination direction of division reflection surface 148 is referred to as first direction D1 (see arrow D1 of FIGS. 1A and 1B and FIGS. 3A and 3B). Division reflection surface 148 and division transmission surface 149 are divided in first direction D1.

Division reflection surface 148 is an inclined surface that is inclined to the optical axis of emission light L incident on first optical surface 141. Division reflection surface 148 reflects a part of emission light L incident on first optical surface 141 toward third optical surface 145. In the present embodiment, division reflection surface 148 is tilted such that the distance to second optical surface 144 (optical transmission member 160) decreases from the top surface toward the bottom surface of optical receptacle 140. The inclination angle of division reflection surface 148 is 45 degrees to the optical axis of emission light L incident on first optical surface 141. Division reflection surface 148 is divided in first direction D1 at a predetermined interval. Division reflection surfaces 148 are parallel to each other in first direction D1.

Division transmission surface 149 is a surface which is formed at a position different from division reflection surface 148 and is perpendicular to the optical axis of emission light L incident on first optical surface 141 and the optical axis of reception light Lr incident on second optical surface 144. Division transmission surface 149 allows a part of emission light L incident on first optical surface 141 to pass therethrough, and emits the light to the outside of optical receptacle 140 (see FIG. 1A). In addition, division transmission surface 149 allows at least a part of reception light Lr incident on second optical surface 144 to pass therethrough to first optical surface 141 side. Division transmission surface 149 is also divided in first direction D1 at a predetermined interval. Division transmission surfaces 149 are parallel to each other in first direction D1.

In one separation unit 147, division reflection surface 148 and division transmission surface 149 are disposed in first direction (a direction from the top surface to the bottom surface) D1 in the named order. Ridgeline 151 is formed between division reflection surface 148 and division transmission surface 149. Ridgelines 151 adjacent to one another are parallel to one another in first direction D1. The smaller one of the angles between division transmission surface 149 and division step surface 150 is 135 degrees. In addition, the smaller one of the angles between division reflection surface 148 and division transmission surface 149 (of adjacent separation unit 147) is 135 degrees. In light separation part 142, a plurality of separation units 147 are disposed in first direction D1.

As illustrated in FIG. 3B, a part of emission light L incident on first optical surface 141 is internally incident on division reflection surface 148 at an incident angle greater than the critical angle. Division reflection surface 148 reflects, toward third optical surface 145, a part of emission light L incident on first optical surface 141, and generates monitor light Lm. On the other hand, division transmission surface 149 allows a part of emission light L incident on first optical surface 141 to pass therethrough, and generates signal light Ls travelling toward end surface 126 of optical transmission member 160. At this time, since division transmission surface 149 is perpendicular to emission light L, signal light Ls is emitted without being refracted.

The ratio between the quantity of signal light Ls and the quantity of monitor light Lm is not limited as long as monitor light Lm capable of monitoring the intensity and the quantity of light L emitted from light emitting element 122 can be obtained while ensuring a desired quantity of signal light Ls. Preferably, the ratio of the quantity of signal light Ls to the quantity of monitor light Lm is 6 to 4, to 8 to 2, or more preferably, 7 to 3.

Transmission surface 143 is disposed on the top surface side of optical receptacle 140 and is configured to allow signal light Ls emitted from light separation part 142 to again enter optical receptacle 140. In addition, transmission surface 143 emits reception light Lr incident on second optical surface 144. In the present embodiment, transmission surface 143 is a surface perpendicular to the optical axis of signal light Ls separated at light separation part 142 and the optical axis of reception light Lr incident on second optical surface 144. With this configuration, it is possible to allow signal light Ls travelling toward end surface 126 of optical transmission member 160 to again enter optical receptacle 140 without refracting the light. In addition, it is possible to emit reception light Lr travelling toward light separation part 142 out of optical receptacle 140 without refracting the light.

Second optical surface 144 is an optical surface that emits emission light L incident on first optical surface 141 toward end surface 126 of optical transmission member 160, and refracts reception light Lr emitted from end surface 126 of optical transmission member 160 to allow the light to enter optical receptacle 140. In the present embodiment, a plurality of second optical surfaces 144 are disposed in one line in the long side direction on the front surface of optical receptacle 140 in such a manner as to face end surface 126 of optical transmission member 160. Second optical surface 144 has a shape of a convex lens protruding toward an end surface of optical transmission member 160. With this configuration, signal light Ls which is incident on first optical surface 141 and separated at light separation part 142 can be condensed and efficiently connected to end surface 126 of optical transmission member 160. In addition, reception light Lr emitted from optical transmission member 160 converges. It is to be noted that, in the case where optical transmission members 160 are disposed in two or more lines, the number of the lines of second optical surfaces 144 is identical to that of optical transmission members 160.

Third optical surface 145 is disposed on the bottom surface side of optical receptacle 140 in such a manner as to face detection element 124. In the present embodiment, third optical surface 145 is a convex lens protruding toward detection element 124. Third optical surface 145 causes monitor light Lm separated at light separation part 142 to converge, and emits the light toward detection element 124. In this manner, it is possible to efficiently couple monitor light Lm to detection element 124. Preferably, the central axis of third optical surface 145 is perpendicular to the light reception surface (substrate 121) of detection element 124.

Fixing part 146 fixes end surface 126 of optical transmission member 160 held by ferrule 162 at a predetermined position of optical receptacle 140. Fixing part 146 fixes optical transmission member 160 such that signal light Ls emitted from second optical surface 144 reaches end surface 126 of optical transmission member 160 at a remote position relative to a focus of the second optical surface 144. Fixing part 146 is disposed on the front surface of optical receptacle 140 and includes positioning recess 152 and positioning hole 153. Positioning recess 152 is disposed at a center portion on the front surface of optical receptacle 140. In addition, second optical surfaces 144 are disposed on the bottom of positioning recess 152. The shape of positioning recess 152 in plan view is not limited. In plan view, the shape of positioning recess 152 and the shape of ferrule 162 are similar to each other. Step 154 for setting the position of ferrule 162 is disposed in positioning recess 152. Step 154 is formed to protrude to the inside from the inner wall of positioning recess 152. In addition, positioning hole 153 is disposed at outer end portions of positioning recess 152 in the long side direction in such a manner as to correspond to a positioning protrusion (omitted in the drawing) of ferrule 162. The positioning protrusion of ferrule 162 is inserted to positioning hole 153 of optical receptacle 140. With this configuration, when the positioning protrusion of ferrule 162 is inserted to positioning hole 153 of optical receptacle 140 and an end surface of ferrule 162 is brought into contact with step 154, the position of ferrule 162 (end surface 126 of optical transmission member 160) is set with respect to optical receptacle 140, and ferrule 162 (end surface 126 of optical transmission member 160) is fixed thereto.

One feature of optical receptacle 140 and optical module 100 according to the present embodiment is the positional relationship between focus f of second optical surface 144 and end surface 126 of optical transmission member 160. That is, the position where positioning recess 152 sets the position of end surface 126 of optical transmission member 160 with respect to focus f of second optical surface 144 is an important point. In view of this, the positional relationship between focus f of second optical surface 144 and end surface 126 of optical transmission member 160 is described in detail.

Figure 4A:
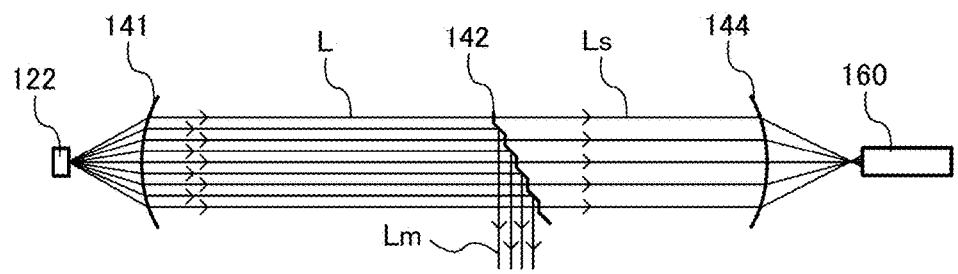
FIGS. 4A and 4B illustrate light paths of the transmission side in the optical module.
Figure 4B:
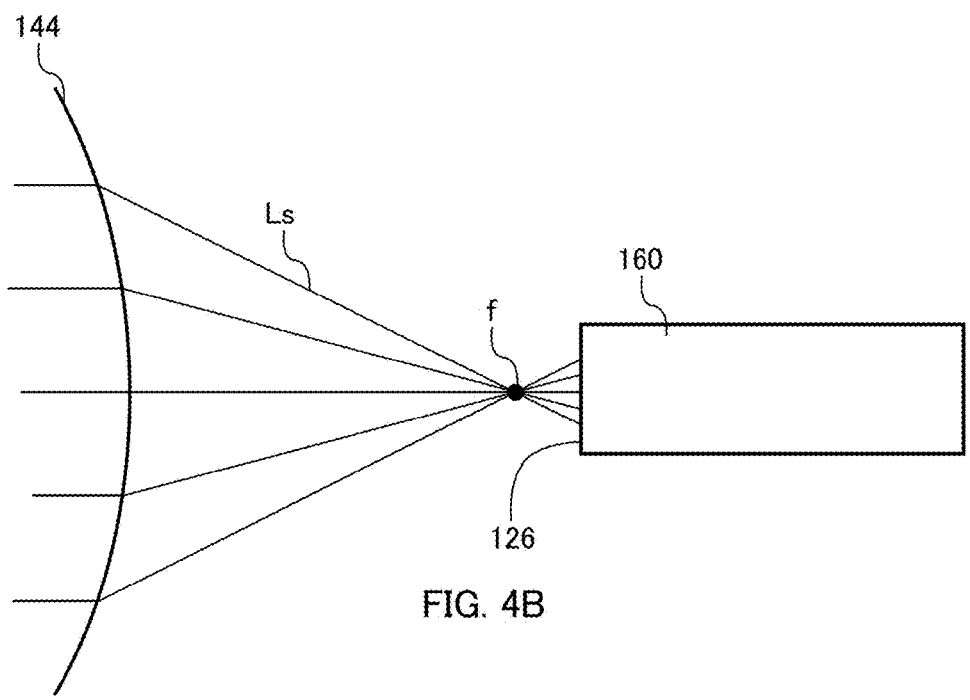

FIG. 4A illustrates light paths of emission light L of the transmission side in optical module 100 according to Embodiment 1, and FIG. 4B illustrates light paths of emission light L in a region around optical transmission member 160. It is to be noted that, in FIGS. 4A and 4B, only light emitting element 122, first optical surface 141, light separation part 142, second optical surface 144, and optical transmission member 160 are illustrated.

As illustrated in FIG. 1A and FIG. 4A, in the transmission side region in optical module 100 according to Embodiment 1, emission light L emitted from light emitting element 122 enters optical receptacle 140 from first optical surface 141. At this time, emission light L is converted into collimate light by first optical surface 141. Emission light L having entered optical receptacle 140 is separated by light separation part 142 into monitor light Lm travelling toward detection element 124 and signal light Ls travelling toward optical transmission member 160. Monitor light Lm separated toward detection element 124 is emitted from third optical surface 145 and reaches detection element 124. On the other hand, the light transmitted toward optical transmission member 160 is emitted from second optical surface 144, and reaches end surface 126 of optical transmission member 160.

As illustrated in FIG. 4B, signal light Ls separated at light separation part 142 is emitted toward end surface 126 of optical transmission member 160 while converging at second optical surface 144. The emitted signal light Ls passes through focus f of second optical surface 144 and thereafter reaches end surface 126 of optical transmission member 160. That is, positioning recess 152 sets the position of end surface 126 of optical transmission member 160 such that signal light Ls emitted from second optical surface 144 reaches end surface 126 of optical transmission member 160 at a remote position relative to focus f of second optical surface 144. It is to be noted that the light flux diameter of signal light Ls emitted from second optical surface 144 gradually decreases toward focus f, and gradually increases after the light passes through focus f. In view of this, it is preferable to dispose end surface 126 of optical transmission member 160 at a position where the light flux diameter of signal light Ls after passing through focus f falls within the end surface of the core. With such a configuration, the use efficiency of signal light Ls emitted from light emitting element 122 and separated at light separation part 142 is not reduced.

Figure 5A:
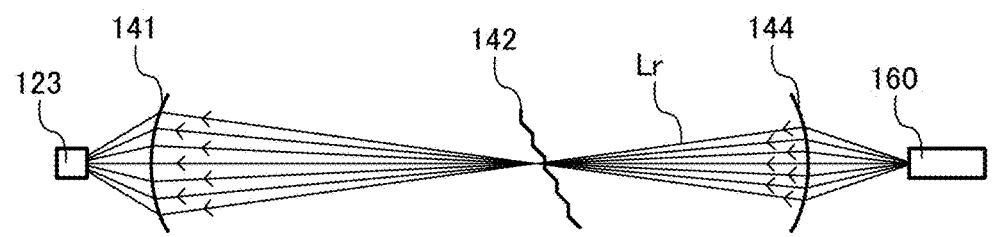
FIGS. 5A and 5B illustrate light paths of the reception side in the optical module.
Figure 5B:
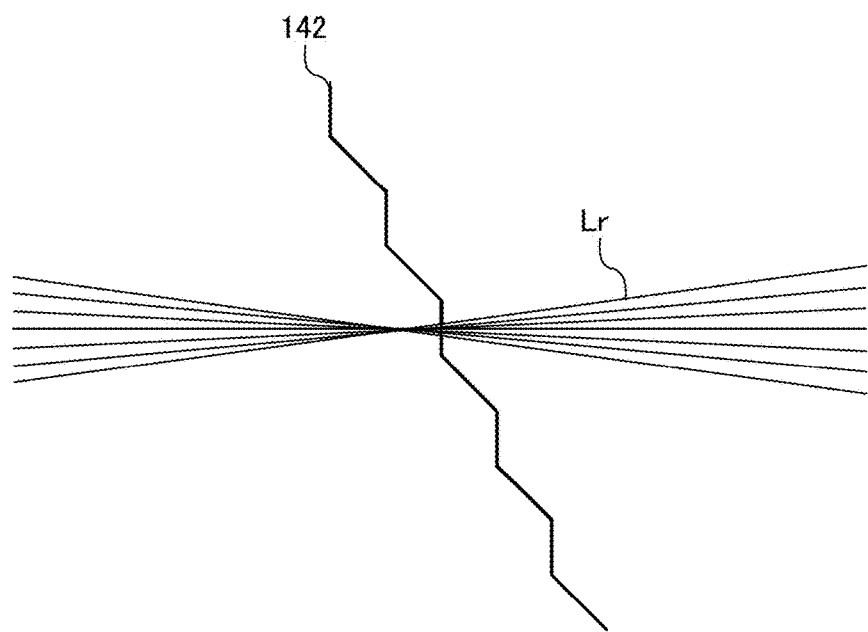

Next, light paths of reception light Lr of the reception side in optical module 100 according to Embodiment 1 will be described. FIG. 5A illustrates light paths of reception light Lr in the reception side region in optical module 100 according to Embodiment 1, and FIG. 5B illustrates light paths of reception light Lr in a region around light separation part 142. It is to be noted that, in FIGS. 5A and 5B, only light receiving element 123, first optical surface 141, light separation part 142, second optical surface 144, optical transmission member 160 are illustrated.

As illustrated in FIG. 1B and FIG. 5A, in the reception side region in optical module 100 according to the present embodiment, reception light L emitted from end surface 126 of optical transmission member 160 enters optical receptacle 140 from second optical surface 144. The light flux diameter of the light having entered optical receptacle 140 decreases as the light travels toward light separation part 142. That is, the light flux diameter at light separation part 142 of reception light Lr incident on second optical surface 144 is smaller than the light flux diameter at second optical surface 144 of reception light Lr. Here, when the position of an end surface of optical transmission member 160 is set such that signal light Ls (collimate light) having traveled through the inside of optical receptacle 140 is condensed at an end surface of optical transmission member 160 (such that the light flux diameter is minimized at end surface 126 of optical transmission member 160), reception light Lr emitted from end surface 126 of optical transmission member 160 is converted by second optical surface 144 into collimate light. However, in optical receptacle 140 according to the present embodiment, end surface 126 of optical transmission member 160 is disposed at a remote position relative to focus f of second optical surface 144, and thus reception light Lr which is emitted from end surface 126 of optical transmission member 160 and is incident on second optical surface 144 can converge. In this manner, the quantity of reception light Lr which is reflected at division reflection surface 148 of light separation part 142 can be reduced.

It is to be noted that the ratio of the light flux diameter at light separation part 142 of reception light Lr incident on second optical surface 144 to the light flux diameter at second optical surface 144 of reception light Lr is not limited as long as the above-described conditions are satisfied. From the viewpoint of efficiently causing reception light Lr to reach light receiving element 123, the quantity of reception light Lr which reaches division transmission surface 149 is preferably greater than the quantity of reception light Lr which reaches division reflection surface 148. In other words, regarding the irradiation spot (light flux) of reception light Lr which is incident on second optical surface 144 and reaches light separation part 142, the area of the irradiation spot on division transmission surface 149 is preferably greater than the irradiation spot on division reflection surface 148. With this configuration, the proportion of reception light Lr which passes through light separation part 142 can be increased, and the use efficiency of reception light Lr is not significantly reduced.

It is to be noted that, in the present embodiment, the light incident on second optical surface 144 passes through one division transmission surface 149 (see FIG. 5B). That is, in the present embodiment, the light flux diameter on light separation part 142 of reception light Lr incident on second optical surface 144 is smaller than division transmission surface 149. Thus, the whole reception light Lr emitted from optical transmission member 160 can be guided to light receiving element 123. As described above, in light separation part 142, the way of setting the light flux diameter of reception light Lr to a small value is not limited. For example, the light flux diameter of reception light Lr on light separation part 142 can be set to a small value by increasing (reducing) the lens diameter, or by reducing (increasing) the curvature. In addition, the light flux diameter of reception light Lr on light separation part 142 can be set to a small value by changing the distances among first optical surface 141, light separation part 142 and second optical surface 144.

(Simulation 1)

Figure 6A:
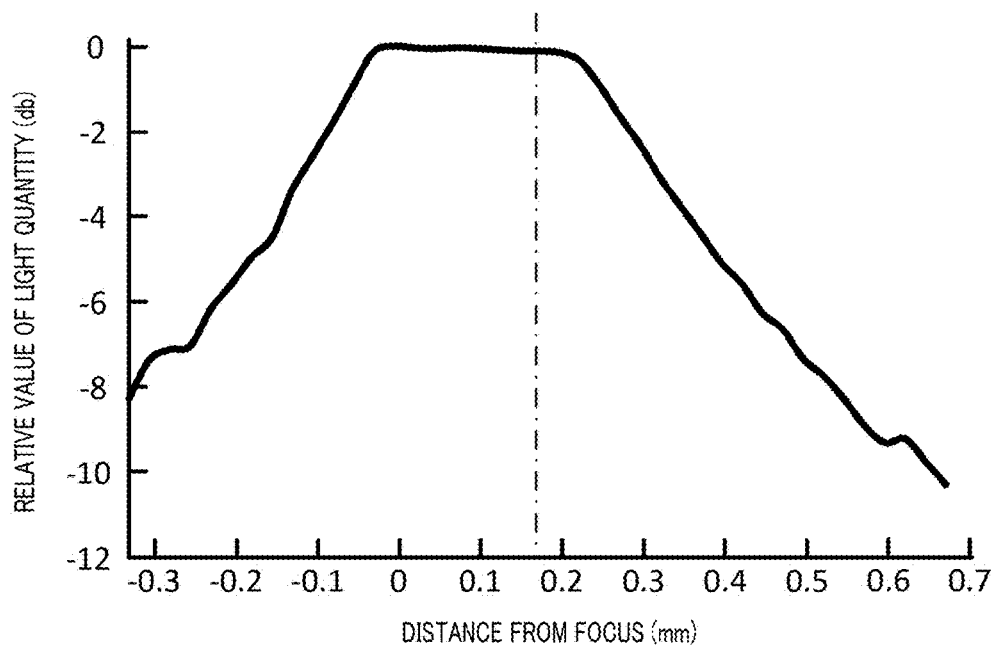
FIGS. 6A and 6B illustrate a simulation of light which reaches an optical transmission member.
Figure 6B:
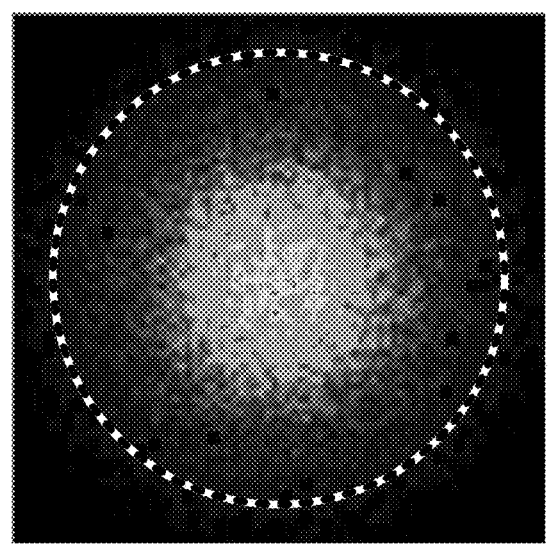

In Simulation 1, the relationship between the quantity of signal light which reaches end surface 126 of optical transmission member 160, and the distance between second optical surface 144 and end surface 126 of optical transmission member 160 in the transmission side region was simulated. FIGS. 6A and 6B show the simulation. FIG. 6A is a graph showing a relationship between the position of end surface 126 of optical transmission member 160, and the quantity of signal light which reaches end surface 126 of optical transmission member 160. The abscissa indicates the position (offset distance) of end surface 126 of optical transmission member 160 with respect to focus f of second optical surface 144. The ordinate indicates the relative value (db) of the quantity of signal light Ls which reaches end surface 126 of optical transmission member 160 with respect to the quantity of signal light Ls which reaches end surface 126 of optical transmission member 160 in the case where the offset distance is 0 mm. FIG. 6B illustrates the luminous intensity distribution at end surface 126 of optical transmission member 160 at the position of the dashed line of FIG. 6A (the position remote from focus f by 0.175 mm). In addition, in FIG. 6B, a measurement region of 50 µm×50 µm is used. In this simulation, the distance between light emitting element 122 and first optical surface 141 is 0.28 mm, the distance between first optical surface 141 and the center of light separation part 142 is 1.02 mm, the distance between the center of light separation part 142 and second optical surface 144 is 2.8 mm, and the distance between second optical surface 144 and optical transmission member 160 is 0.43 mm.

As illustrated in FIGS. 4B, 6A and 6B, it was confirmed that the quantity of signal light Ls is kept at a constant value in a region around focus f of second optical surface 144. This means that the irradiation spot (light flux) of signal light Ls falls within end surface 126 of optical transmission member 160. In addition, it was confirmed that, when the distance of focus f of second optical surface 144 from end surface 126 of optical transmission member 160 significantly increases, the quantity of received signal light Ls decreases. This means that the irradiation spot (light flux) of signal light Ls falls outside end surface 126 of second optical surface 144, and that signal light Ls also reaches the region outside end surface 126 of optical transmission member 160. It can be said from this simulation that the distance from focus f of second optical surface 144 may be set to 0.2 mm.

(Simulation 2)

Figure 7A:
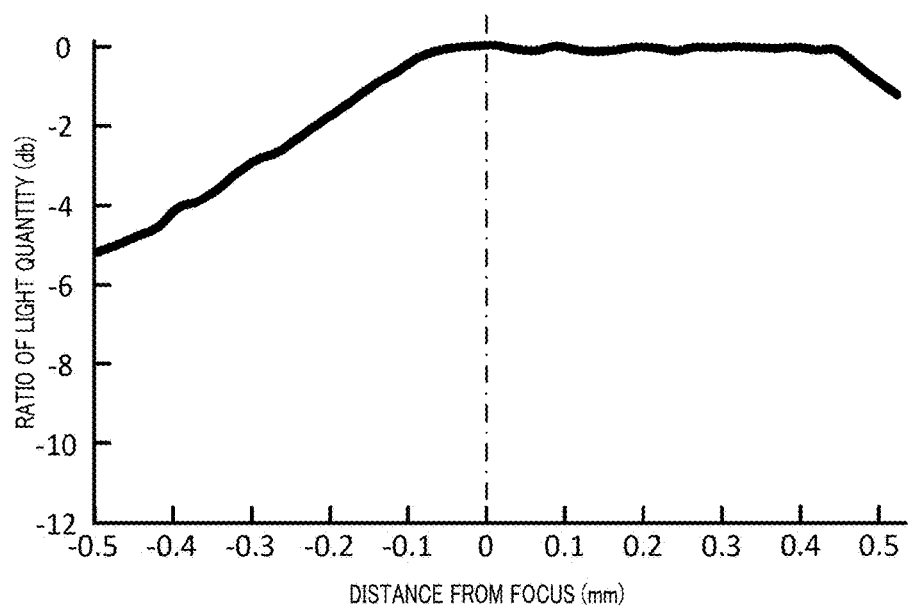
FIGS. 7A and 7B illustrate a simulation of light which reaches a light receiving element.
Figure 7B:
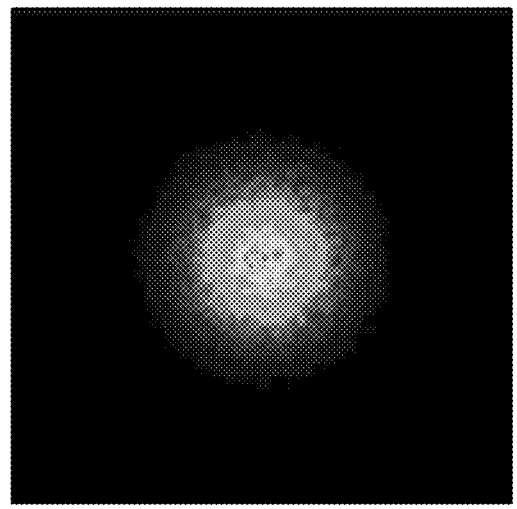

In Simulation 2, in the case where end surface 126 of optical transmission member 160 is fixed at a position remote from focus f of second optical surface 144 by 0.175 mm (the position of the dashed line in FIG. 6A), the relationship between the distance from end surface 126 of first optical surface 141 and light receiving element 123, and the quantity of the reception light which reaches light reception surface 127 of light receiving element 123 was simulated. End surface 126 of optical transmission member 160 is set at a position remote from focus f of second optical surface 144 by 0.175 mm, because, under that condition, the light flux diameter of reception light Lr emitted from optical transmission member 160 is minimized at light separation part 142. FIGS. 7A and 7B show the simulation. FIG. 7A is a graph illustrating the relationship between the position of light reception surface 127 of light receiving element 123, and the quantity of the reception light which reaches light reception surface 127 of light receiving element 123. The abscissa indicates the position (offset distance) of light reception surface 127 of light receiving element 123 to focus f of first optical surface 141. The ordinate indicates the relative value (db) of the quantity of signal light Ls which reaches light reception surface 127 of light receiving element 123 with respect to the quantity of reception light Lr which reaches light reception surface 127 of light receiving element 123 in the case where the offset distance is 0 mm. FIG. 7B illustrates the luminous intensity distribution at light reception surface 127 of light receiving element 123 at the position of the dashed line of FIG. 7A. In addition, in FIG. 7B, a measurement region of 70 µm×70 µm is used.

As illustrated in FIGS. 5B, 7A and 7B, it was confirmed that the quantity of the received light is kept at a constant value in a region around focus f of first optical surface 141. This means that the irradiation spot (light flux) of reception light Lr falls within light reception surface 127 of light receiving element 123. In addition, it was confirmed that, when the position of light reception surface 127 of light receiving element 123 is significantly apart from the light reception surface 127 of light receiving element 123, the quantity of received reception light Lr is reduced. This means that the irradiation spot (light flux) of reception light Lr falls outside light reception surface 127 of light receiving element 123, and reception light Lr did not reached light reception surface 127 of light receiving element 123. That is, under the condition where the light flux diameter of reception light Lr at light separation part 142 is minimized, the light flux diameter at light reception surface 127 of light receiving element 123 is not minimized, but falls within a diameter range of 70 µm (light reception surface 127 of light receiving element 123 for high-speed communication of 10 Gbps). It is to be noted that, when reception light Lr emitted from first optical surface 141 falls outside light reception surface 127 of light receiving element 123, it suffices to adjust the height of light reception surface 127 of light receiving element 123.

As shown by Simulation 1 and Simulation 2, it was confirmed that there is a range where reception light Lr emitted from optical transmission member 160 can appropriately reach light reception surface 127 of light receiving element 123 even in the case where the position of end surface 126 of optical transmission member 160 is adjusted such that the light flux diameter of reception light Lr is minimized at light separation part 142.

(Effect)

As described above, in optical module 100 according to Embodiment 1, emission light L which is emitted from light emitting element 122 and has entered optical receptacle 140 reaches end surface 126 of optical transmission member 160 at a position after focus f of second optical surface 144 from which light is emitted out of optical receptacle 140. In addition, reception light Lr emitted from end surface 126 of optical transmission member 160 enters optical receptacle 140 toward light separation part 142 while converging at second optical surface 144. The most part of reception light Lr having entered optical receptacle 140 passes through light separation part 142 (division transmission surface 149) and is emitted from first optical surface 141. With this configuration, even when used as the transmission side and the reception side, optical module 100 can suppress reduction of the quantity of the light which is emitted from optical transmission member 160 and reaches light receiving element 123 while maintaining the quantity of emission light L of the transmission side reaching optical transmission member 160.

Embodiment 2

Optical module 200 according to Embodiment 2 is different from optical module 100 according to Embodiment 1 in configurations of photoelectric conversion device 220 and optical receptacle 240. In view of this, the configurations similar to those of Embodiment 1 are denoted with the same reference numerals, and the description thereof will be omitted.

(Configuration of Optical Module)

Figure 8A:
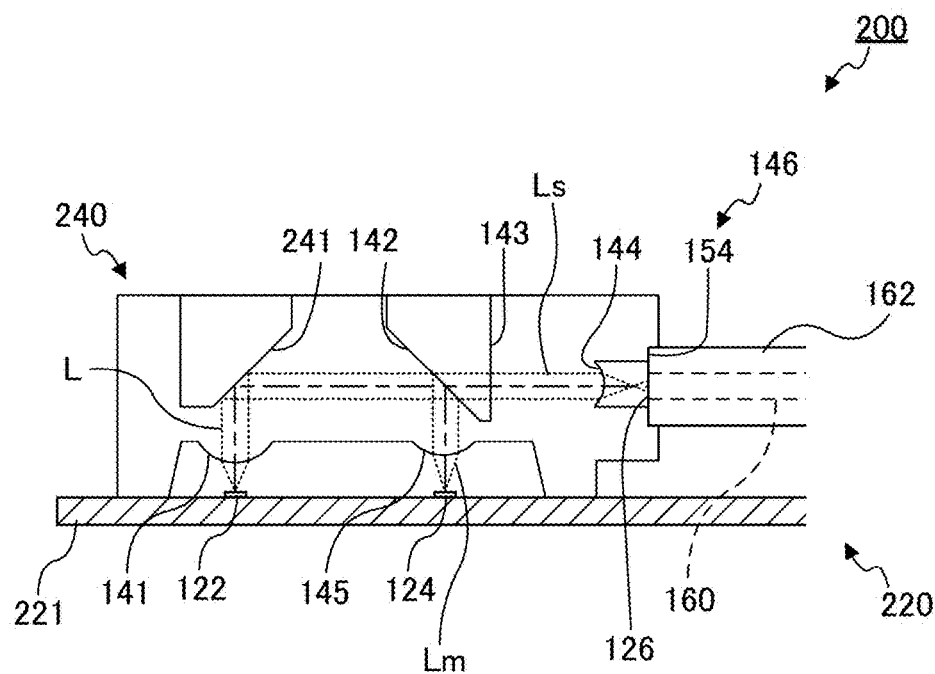
FIGS. 8A and 8B are sectional views of an optical module according to Embodiment 2.
Figure 8B:
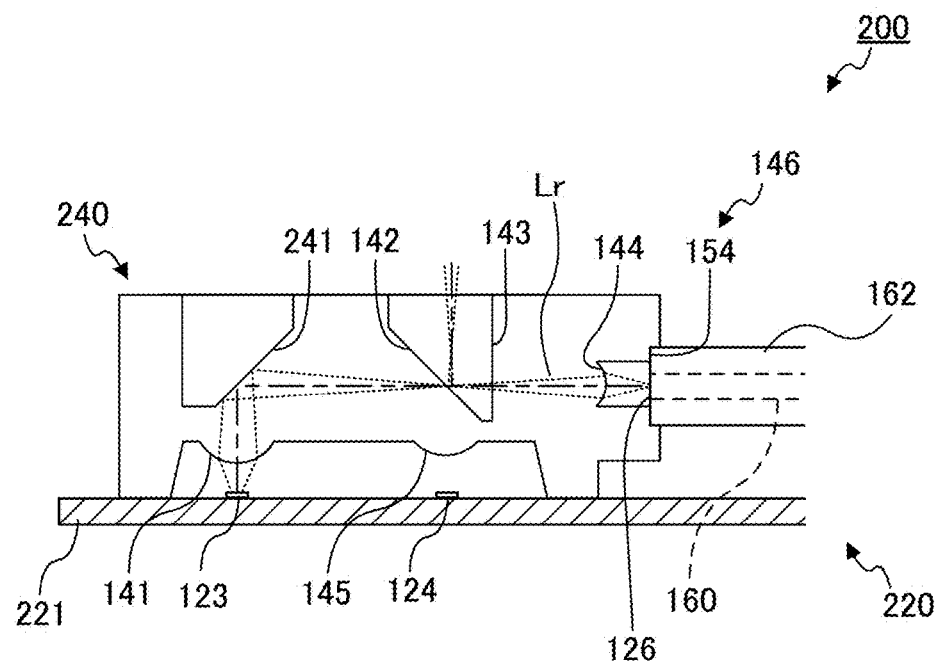

FIGS. 8A and 8B are sectional views of optical module 200 according to Embodiment 2 of the present invention. FIG. 8A illustrates light paths in the transmission side region of optical module 200, and FIG. 8B illustrates light paths in the reception side region of optical module 200. In FIGS. 8A and 8B, the hatching of the cross section of optical receptacle 240 is omitted to illustrate light paths in optical receptacle 240.

As illustrated in FIGS. 8A and 8B, optical module 200 according to Embodiment 2 includes photoelectric conversion device 220 and optical receptacle 240. Photoelectric conversion device 220 includes substrate 221, four light emitting elements 122, four light receiving elements 123, and four detection elements 124. Substrate 221 has a shape of a flat plate, for example. Light emitting element 122, light receiving element 123 and detection element 124 are disposed on one surface of substrate 221.

(Configuration of Optical Receptacle)

Figure 9A:
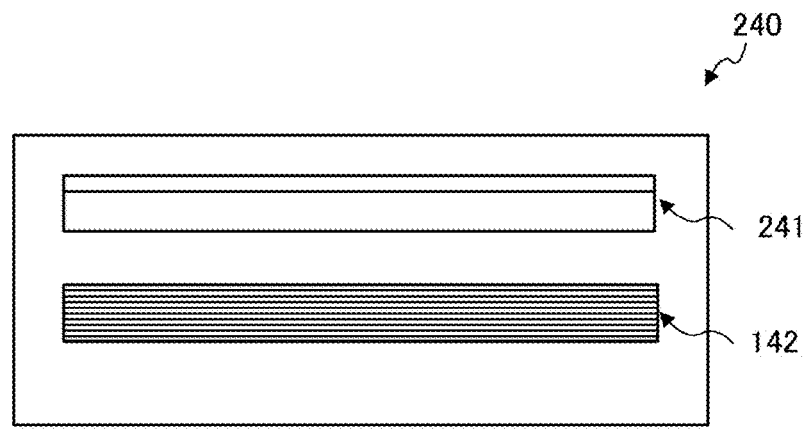
FIGS. 9A to 9C illustrate a configuration of an optical receptacle according to Embodiment 2.
Figure 9B:
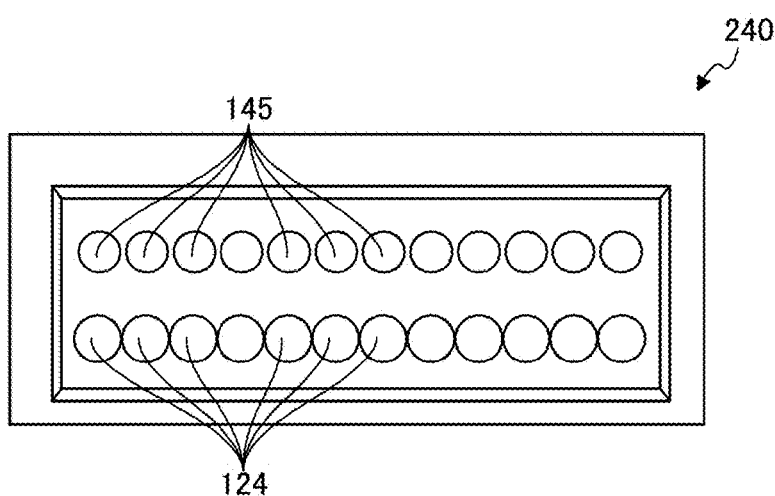
Figure 9C:
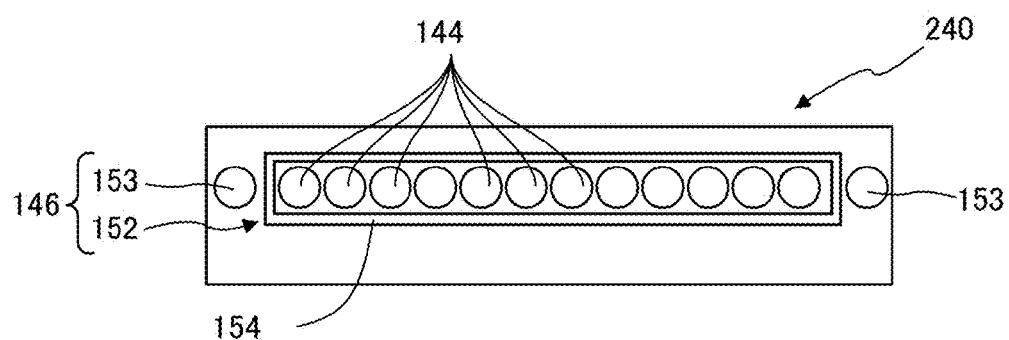

FIGS. 9A to 9C illustrate a configuration of optical receptacle 240 according to Embodiment 2. FIG. 9A is a plan view of optical receptacle 240, FIG. 9B is a bottom view of optical receptacle 240, and FIG. 9C is a front view of optical receptacle 240.

As illustrated in FIGS. 9A to 9C, optical receptacle 240 according to Embodiment 2 includes a plurality of first optical surfaces 141, reflection surface 241, light separation part 142, transmission surface 143, a plurality of second optical surfaces 144, a plurality of third optical surfaces 145 and fixing part 146.

First optical surface 141 and third optical surface 145 are disposed on the bottom surface side of optical receptacle 240. In addition, second optical surface 144 is disposed on the front surface of optical receptacle 240.

Reflection surface 241 is an inclined surface formed on the top surface side of the optical receptacle 240. Reflection surface 241 reflects emission light L incident on first optical surface 141 toward light separation part 142, and reflects reception light Lr having passed through light separation part 142 toward first optical surface 141. Reflection surface 241 is tilted such that the distance to optical transmission member 160 decreases from the bottom surface toward the top surface of optical receptacle 240. In the present embodiment, the inclination angle of reflection surface 241 is 45 degrees to the optical axis of emission light L incident on first optical surface 141. Emission light L incident on first optical surface 141 is internally incident on reflection surface 241 at an incident angle greater than the critical angle, and reception light Lr having passed through light separation part 142 is internally incident on reflection surface 241 at an incident angle greater than the critical angle. In this manner, reflection surface 241 totally reflects the incident emission light L in the direction along the surface of substrate 221, and totally reflects reception light Lr in the direction perpendicular to the surface of substrate 221.

Figure 10A:
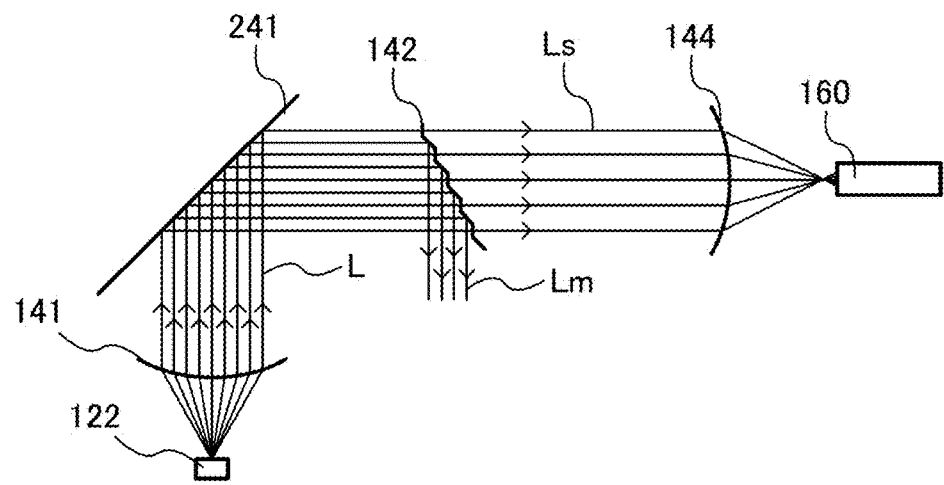
FIG. 10A illustrates light paths of the transmission side in an optical module.
Figure 10B:
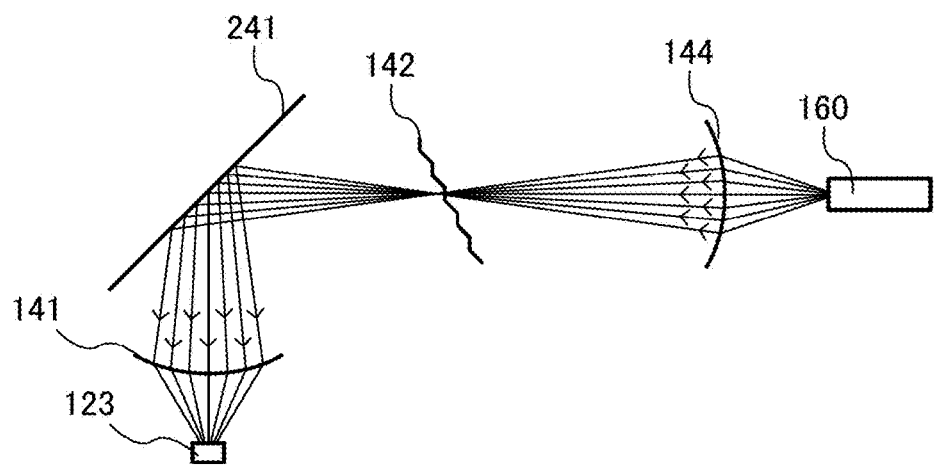
FIG. 10B illustrates light paths of the reception side in the optical module.

FIG. 10A illustrates light paths of emission light L of the transmission side in optical module 200 according to Embodiment 2, and FIG. 10B illustrates light paths of reception light Lr of the reception side in optical module 200 according to Embodiment 2. It is to be noted that FIGS. 10A and 10B illustrate only light emitting element 122 (light receiving element 123), first optical surface 141, reflection surface 241, light separation part 142, second optical surface 144, and optical transmission member 160.

As illustrated in FIG. 10A, on the transmission side of optical module 200 according to Embodiment 2, emission light L emitted from light emitting element 122 enters optical receptacle 240 from first optical surface 141. Emission light L having entered optical receptacle 240 is reflected by reflection surface 241 toward light separation part 142. Emission light L reflected by reflection surface 241 is separated by light separation part 142 into monitor light Lm travelling toward detection element 124 and signal light Ls travelling toward optical transmission member 160. Monitor light Lm separated toward detection element 124 is emitted from third optical surface 145, and reaches detection element 124. On the other hand, the light having passed therethrough toward optical transmission member 160 is emitted from second optical surface 144, and reaches end surface 126 of optical transmission member 160.

As illustrated in FIG. 10B, on the reception side of optical module 200 according to the present embodiment, reception light Lr emitted from optical transmission member 160 enters optical receptacle 240 from second optical surface 144. The light flux diameter of reception light Lr having entered optical receptacle 240 decreases toward light separation part 142, and the reception light Lr passes through light separation part 142 (division transmission surface 149). Reception light Lr having passed through light separation part 142 (division transmission surface 149) is reflected by reflection surface 241 toward first optical surface 141. Reception light Lr reflected by reflection surface 241 is emitted from first optical surface 141, and reaches light reception surface 127 of light receiving element 123.

(Effect)

With this configuration, optical module 200 according to Embodiment 2 has an effect similar to that of optical module 200 according to Embodiment 1. In addition, since light emitting element 122, light receiving element 123 and detection element 124 are disposed on the same plane, optical module 200 can be downsized.

Figure 11A:
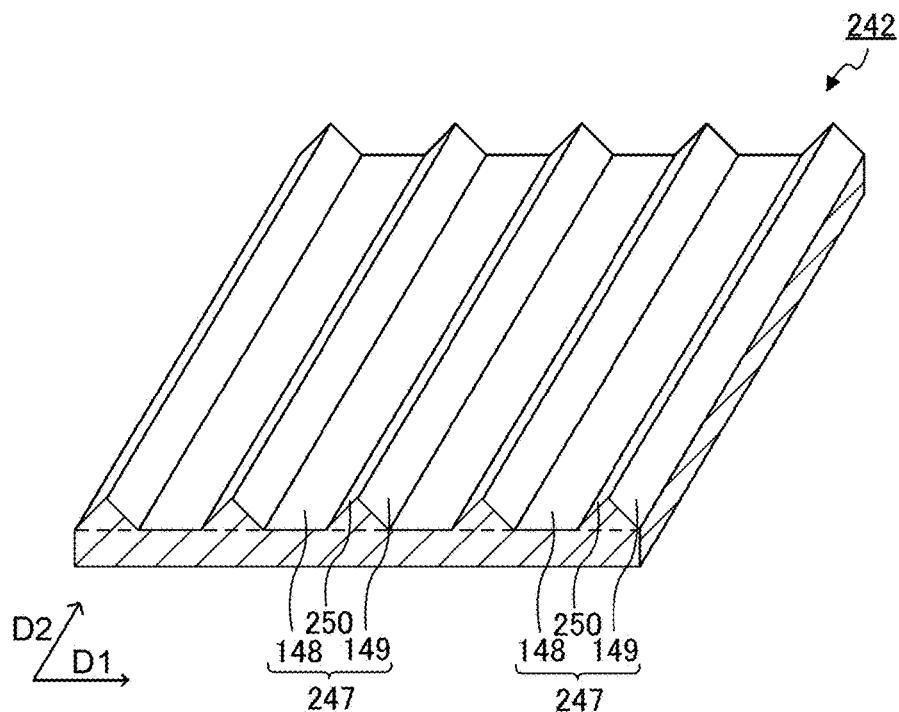
FIGS. 11A and 11B illustrate a configuration of a light separation part according to a modification.

It is to be noted that, as illustrated in FIG. 11A, light separation unit 247 of light separation part 242 may include, in addition to division reflection surface 148 and division transmission surface 149, division step surface 250 disposed between division reflection surface 148 and division transmission surface 149. In this case, division step surface 250 is parallel to the optical axis of emission light L incident on first optical surface 141, and connects division reflection surface 148 and division transmission surface 149. A plurality of division step surfaces 250 are disposed such that division step surfaces 250 are parallel to each other in first direction D1.

Figure 11B:
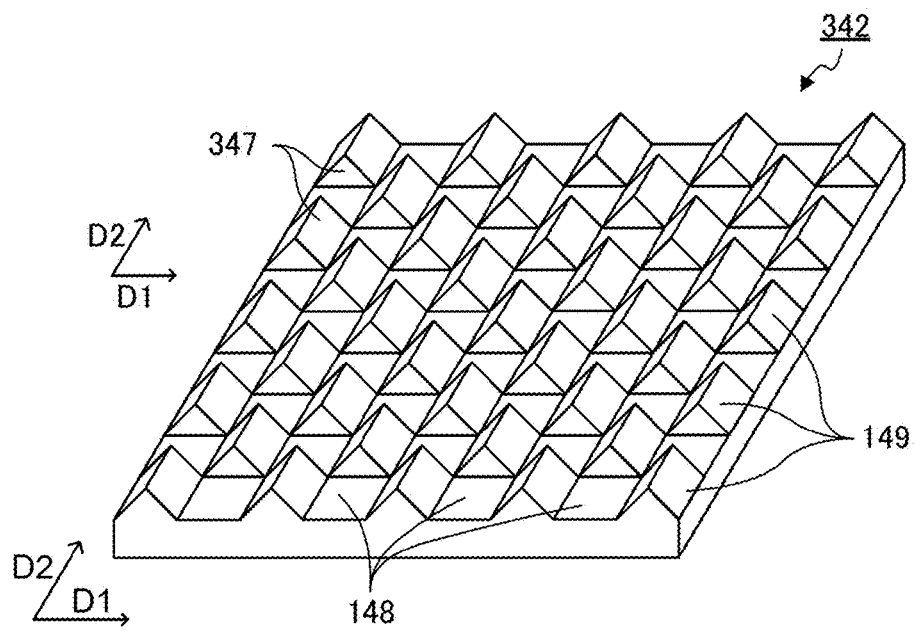

In addition, as illustrated in FIG. 11B, light separation units 347 of light separation part 342 are alternately disposed in first direction D1 and second direction D2 orthogonal to first direction D1 in a matrix. Here, the "second direction" is direction D2 which is orthogonal to first direction D1 (see arrow D2 of FIG. 11) along division reflection surface 148.

In addition, in optical receptacles 140 and 240 of the embodiments, a reflection film such as a thin film formed of a metal having a high light reflectance (such as Al, Ag and Au) may be formed on reflection surface 241 and division reflection surface 148. When reduction of the number of components is prioritized, it is preferable to employ a configuration using only a total reflection surface as in Embodiment 1 and of Embodiment 2.

In optical receptacles 140 and 240 according to Embodiments 1 and 2, first optical surface 141 converts the incident light into collimate light, first optical surface 141 may convert the incident emission light L into light other than collimate light. To be more specific, incident light L may be converted into light whose light flux diameter gradually increases, or light whose light flux diameter gradually decreases.

This application is entitled to and claims the benefit of Japanese Patent Application No. 2014-158787 filed on Aug. 4, 2014, the disclosure each of which including the specification, drawings and abstract is incorporated herein by reference in its entirety.

INDUSTRIAL APPLICABILITY

The optical receptacle and the optical module according to the embodiments of the present invention are suitable for optical communications using an optical transmission member.

REFERENCE SIGNS LIST 100, 200 Optical module
120, 220 Photoelectric conversion device
121, 221 Substrate
122 Light emitting element
123 Light receiving element
124 Detection elements
125 Light emitting surface
126 End surface
127 Light reception surface
140, 240 Optical receptacle
141 First optical surface
142, 242, 342 Light separation part
143 Transmission surface
144 Second optical surface
145 Third optical surface
146 Fixing part
147 Separation unit
148 Division reflection surface
149 Division transmission surface
151 Ridgeline
152 Positioning recess
153 Positioning hole
154 Step
160 Optical transmission member
162 Ferrule
241 Reflection surface
247, 347 Light separation unit
250 Division step surface
f Focus
L Emission light
Lm Monitor light
Ls Signal light
Lr Reception light

The invention claimed is:

1. An optical receptacle configured to be disposed between one or more optical transmission members and one or more photoelectric conversion devices including one or more photoelectric conversion elements and one or more detection elements for monitoring light emitted from the photoelectric conversion element, the optical receptacle being configured for optically coupling the photoelectric conversion element and an end surface of the optical transmission member, the optical receptacle comprising:

one or more first optical surfaces configured to at least one of:
    allow an incidence of light emitted from the photoelectric conversion element, or
    emit, toward the photoelectric conversion element, light which is emitted from the end surface of the optical transmission member and is advanced through an inside of the optical receptacle;
one or more second optical surfaces configured to at least one of:
    emit, toward the end surface of the optical transmission member, light incident on the first optical surface, or
    allow an incidence of light emitted from the end surface of the optical transmission member;
a light separation part disposed on a light path between the first optical surface and the second optical surface, and configured to at least one of:
    separate light incident on the first optical surface into monitor light travelling toward the detection element and signal light travelling toward the end surface of the optical transmission member, or
    allow at least a part of light incident on the second optical surface to pass therethrough toward the first optical surface side;
one or more third optical surfaces configured to emit, toward the detection element, monitor light separated at the light separation part; and
a fixing part configured to dispose the end surface of the optical transmission member such that the end surface faces the second optical surface, wherein:
the fixing part fixes the optical transmission member such that signal light emitted from the second optical surface reaches the end surface of the optical transmission member at a remote position relative to a focus of the second optical surface,
the light separation part includes a plurality of separation units, each of the plurality of separation units including one division reflection surface that is an inclined surface inclined to an optical axis of light incident on the first optical surface, and one division transmission surface that is a surface perpendicular to the optical axis, the division reflection surface and the division transmission surface being disposed in a first direction that is an inclination direction of the division reflection surface,
the plurality of separation units are disposed in the first direction,
the division reflection surfaces reflect, toward the third optical surface, a part of light incident on the first optical surface,
the division transmission surfaces allow a part of light incident on the first optical surface or the second optical surface to pass therethrough,
a light flux diameter of light from the second optical surface is smaller at the light separation part than at the second optical surface, and
the light flux diameter of the light from the second optical surface is smaller than at least one of the division transmission surfaces at the light separation part.

2. The optical receptacle according to claim 1 further comprising:
a reflection surface disposed on a light path between the first optical surface and the light separation part, and configured to at least one of:
    reflect, toward the light separation part, light incident on the first optical surface, or reflect, toward the first optical surface, light having passed through the separation part.

3. An optical module comprising:
the optical receptacle according to claim 1; and
a photoelectric conversion device including:
  a substrate,
  one or more photoelectric conversion elements disposed on the substrate, and
  one or more detection elements disposed on the substrate and configured to monitor light emitted from the photoelectric conversion device.

4. An optical module comprising:
the optical receptacle according to claim 2; and
a photoelectric conversion device including:
  a substrate,
  one or more photoelectric conversion elements disposed on the substrate, and
  one or more detection elements disposed on the substrate and configured to monitor light emitted from the photoelectric conversion device.

* * * * *